(12) United States Patent
Hongu et al.

(10) Patent No.: US 7,732,012 B2
(45) Date of Patent: Jun. 8, 2010

(54) METHOD FOR MANUFACTURING POLYCRYSTALLINE SILICON, AND POLYCRYSTALLINE SILICON FOR SOLAR CELLS MANUFACTURED BY THE METHOD

(75) Inventors: Tatsuhiko Hongu, Tokyo (JP); Yasuhiro Kato, Tokyo (JP); Hiroshi Hagimoto, Tokyo (JP)

(73) Assignees: Shin-Etsu Film Co., Ltd, Fukui-ken (JP); Sunric Co., Ltd, Tokyo (JP)

( * ) Notice: Subject to any disclaimer, the term of this patent is extended or adjusted under 35 U.S.C. 154(b) by 401 days.

(21) Appl. No.: 11/630,395
(22) PCT Filed: May 16, 2005
(86) PCT No.: PCT/JP2005/008864
§ 371 (c)(1), (2), (4) Date: Dec. 22, 2006
(87) PCT Pub. No.: WO2005/123583
PCT Pub. Date: Dec. 29, 2005

(65) Prior Publication Data
US 2008/0069755 A1  Mar. 20, 2008

(30) Foreign Application Priority Data
Jun. 22, 2004  (JP) ............................. 2004-184092

(51) Int. Cl.
*C23C 14/10* (2006.01)
*C23C 16/00* (2006.01)
*B05D 7/22* (2006.01)
*C01B 33/02* (2006.01)
*C30B 23/00* (2006.01)
*C30B 25/00* (2006.01)
*C30B 28/12* (2006.01)
*C30B 28/14* (2006.01)
*H01L 31/00* (2006.01)

(52) U.S. Cl. ............................. 427/255.27; 427/255.11; 427/255.18; 427/255.22; 427/181; 423/349; 423/350; 117/100; 136/258; 136/261

(58) Field of Classification Search ......... 423/348–350; 136/258, 261; 427/255.11, 255.18, 255.22, 427/255.27, 181; 117/100
See application file for complete search history.

(56) References Cited

U.S. PATENT DOCUMENTS
3,139,363 A  6/1964 Baldrey
(Continued)

FOREIGN PATENT DOCUMENTS
EP  0090321  10/1983
(Continued)

OTHER PUBLICATIONS
Sarret et al. "n-type polycrystalline silicon films obtained by crystallization of in situ phosphorus-doped amorphous silicon films deposited at low pressure", Journal of Applied Physics 76 (9) Nov. 1, 1994.*

*Primary Examiner*—Steven Bos
*Assistant Examiner*—Anthony J Zimmer
(74) *Attorney, Agent, or Firm*—Lowe Hauptman Ham & Berner, LLP

(57) ABSTRACT

Provided is a method for the preparation of polycrystalline silicon in which, in conducting preparation of polycrystalline silicon by the Siemens method or by the monosilane method, no outer heating means is necessitated for the core member (seed rod), onto which polycrystalline silicon is deposited, from the initial stage of heating, the deposition rate is high and the core member seed rod can be used repeatedly.

The method for deposition of high-purity polycrystalline silicon, at a high temperature, onto a white-heated seed rod in a closed reaction furnace by pyrolysis or hydrogen reduction of a starting silane gas supplied thereto, is characterized in that the seed rod is a member made from an alloy having a recrystallization temperature of 1200° C. or higher. It is preferable that the alloy member is of an alloy of Re—W, W—Ta, Zr—Nb, titanium-zirconium, or a carbon-added molybdenum (TZM) in the form of a wire member having a diameter of at least 0.5 mm, a plate member having a thickness of at least 1 mm or a prismatic member, or a tubular member having a diameter of at least 1 mm, wall thickness of at least 0.2 mm with an inner diameter not exceeding 5 mm, that the plate member, wire member, prismatic member or tubular member has a tapered form and further that the tubular member is a tapered duplex tube.

12 Claims, 2 Drawing Sheets

U.S. PATENT DOCUMENTS

| | | | |
|---|---|---|---|
| 4,150,168 A * | 4/1979 | Yatsurugi et al. | 427/588 |
| 4,237,151 A * | 12/1980 | Strongin et al. | 427/74 |
| 4,481,232 A * | 11/1984 | Olson | 427/588 |
| 4,805,556 A * | 2/1989 | Hagan et al. | 118/725 |
| 5,284,640 A * | 2/1994 | Jernegan et al. | 423/349 |
| 5,327,454 A * | 7/1994 | Ohtsuki et al. | 373/133 |

FOREIGN PATENT DOCUMENTS

| | | |
|---|---|---|
| GB | 856137 | 12/1960 |
| JP | 47-22827 A | 10/1972 |
| JP | 57045020 | 9/1982 |
| JP | 57145021 | 9/1982 |
| JP | 60-36317 A | 2/1985 |
| JP | 61281009 | 12/1986 |
| JP | 63123806 | 5/1988 |
| JP | 64056311 | 3/1989 |
| JP | 03150298 | 6/1991 |
| JP | 04016504 | 1/1992 |
| JP | 04037602 | 2/1992 |
| JP | 04338108 | 11/1992 |
| JP | 05139713 | 6/1993 |
| JP | 05139891 | 6/1993 |
| JP | 05270814 | 10/1993 |
| JP | 05330815 | 12/1993 |
| JP | 06172093 | 6/1994 |
| JP | 08169797 | 7/1996 |
| JP | 11116229 | 4/1999 |
| JP | 2002-83983 A | 3/2002 |

* cited by examiner

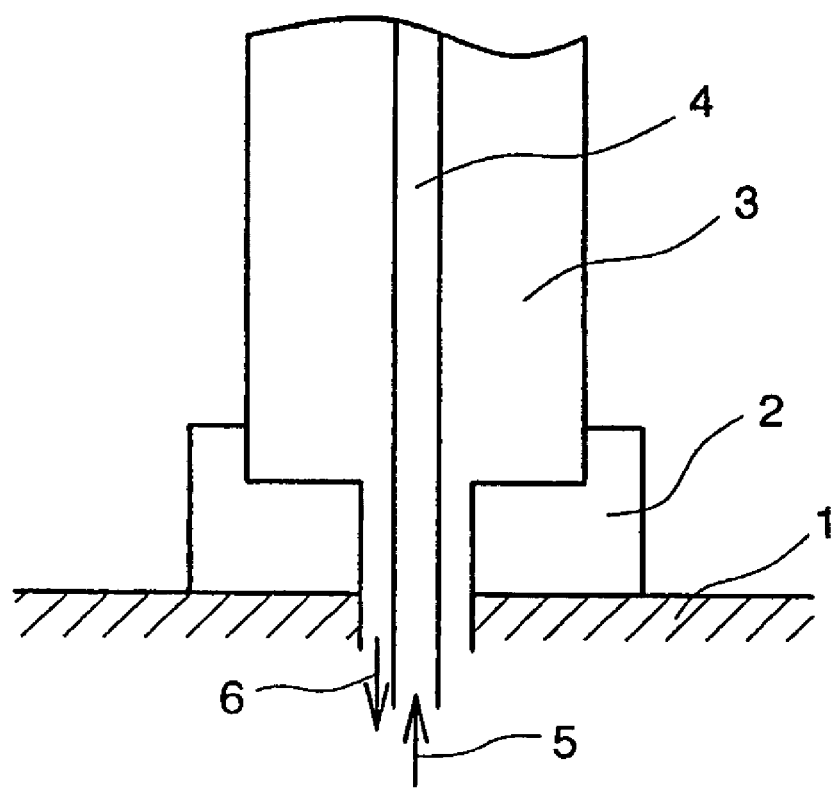
F I G. 1

F I G. 2
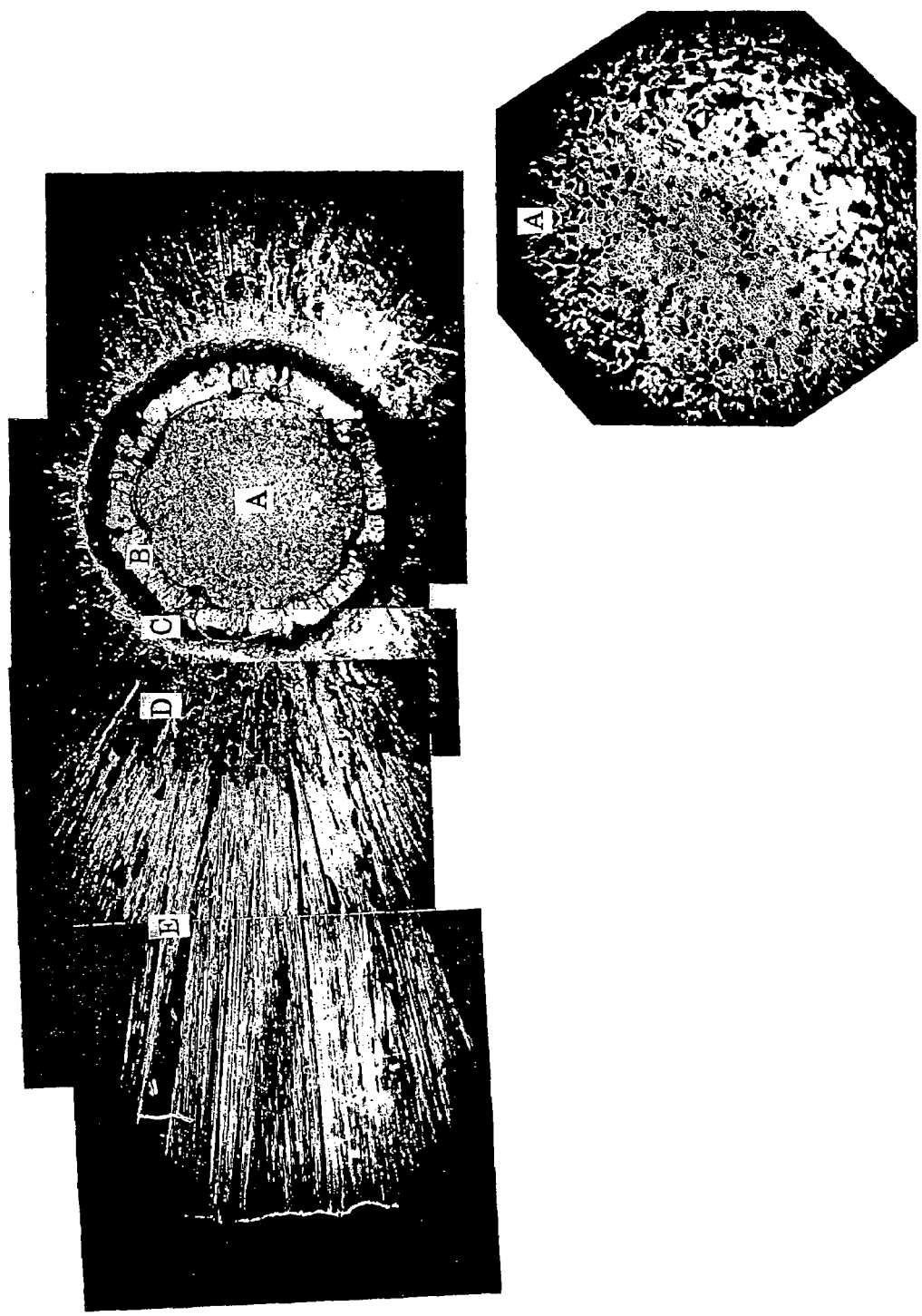

METHOD FOR MANUFACTURING POLYCRYSTALLINE SILICON, AND POLYCRYSTALLINE SILICON FOR SOLAR CELLS MANUFACTURED BY THE METHOD

TECHNOLOGICAL FIELD

The present invention relates to a method for manufacturing high-purity polycrystalline silicon inexpensively and in large quantities, and in, particular, it is an object of the present invention to provide a solar cell silicon element with constancy.

BACKGROUND ART

The major currents of conventional methods for manufacturing high-purity polycrystalline silicon are the Siemens method and the monosilane method. These methods are methods in which a starting-material silane gas is supplied to the interior of a high-temperature reaction furnace from a nozzle installed in the bottom part of this sealed reaction furnace, and polycrystalline silicon is manufactured by the deposition or growth of silicon effected by the pyrolysis or hydrogen reduction of the starting-material gas on the surface of a solid silicon rod (silicon seed rod or core) disposed inside the furnace.

The starting-material silane gas that is used is a chlorosilane expressed by the formula $Cl_nSiH_{4-n}$ (n is an integer from 0 to 4) which is refined to a high purity; this may be monosilane, trichlorosilane or tetrachlorosilane used alone, or may be a mixture of these compounds. However, in the Siemens method, trichlorosilane (n=3) is the main compound used, while in the monosilane method, monosilane (n=0) is the main compound used. The silicon obtained by the pyrolysis or hydrogen reduction of these starting-material gases at a high temperature has the same composition as the silicon seed rod (hereafter referred to as the Si seed rod) set beforehand inside the furnace; accordingly, this silicon has a uniform high purity from the center part to the outer circumferential part. Since this silicon has a purity that is essential in the semiconductor industry, it is called the semiconductor grade polycrystalline silicon (SEG-Si).

In spite of the fact that the Siemens method belongs to a pre-war invention, this method makes it possible to obtain uniform high-purity polycrystalline silicon with constancy; accordingly, the basic conditions of this method remain unchanged today. The reaction equation in the case of trichlorosilane is shown below.

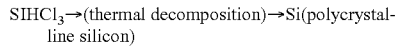

$SIHCl_3 \rightarrow$ (thermal decomposition) $\rightarrow Si$(polycrystalline silicon)

Quartz glass has been used as the material of the initial-stage furnace (bell jar) in the Siemens method. However, as the demand for polycrystalline silicon has grown, the size of the reaction furnace has been increased in order to increase the productivity, and currently, metallic bell jars made of corrosion-resistant metals such as carbon steels and high-nickel steels are at the startline of their use. Furthermore, modifications such as mirror finishing, silver plating or the like of the inside surfaces of the furnace have been used as a means for facilitating easy and uniform temperature control inside the furnace and preventing the loss of thermal energy due to heat radiation (Patent Document 1).

Meanwhile, with an increase in the size of the reaction furnace, the number of seed rods has increased, and the length of the rods has also increased. Accordingly, the yield of high-purity product with good quality and a uniform size has degraded. Furthermore, there have been various proposals in the past regarding improvements in the starting-material gas supply nozzle structure, improvements in the position and structure of the waste gas discharge port (Patent Document 2, Patent Document 3) and elsewhere as a measure for improving the uniformity and smoothness of the rod shape.

In the monosilane method, monosilane ($SiH_4$) is the starting material. The thermal decomposition reaction of monosilane differs from the thermal decomposition in the Siemens method (thermal decomposition temperature 759 to 950° C.) in that this reaction is accompanied by the production of a silicon dust. As in the Siemens method, the core material is an Si rod. Since the polycrystalline silicon obtained uses monosilane as the starting material, there is no chlorine contamination, so that the purity is higher than in the Siemens method; this polycrystalline silicon is used mainly as a base material in the manufacture of single crystals by the FZ (floating zone melting) method.

Meanwhile, with regard to the methods for the manufacture of polycrystalline silicon for use in solar cells, various methods for purifying metallic silicon, fluidized bed reactions and the like have been proposed; however, for the reasons described later, these methods have not been adapted for practical use.

In the Siemens method, purified silane gas is subjected to the pyrolysis or hydrogen reduction inside a sealed vessel that is resistant to contamination, so that SEG-Si is formed. Accordingly, this method offers the advantage of easily producing a high-purity product. However, since the diameter of the Si seed rod on which the silicon polycrystals are deposited following the pyrolysis is extremely slender at around 5 mm, the surface area which is available for deposition in the initial stage of the reaction is so small that this method suffers from the drawback of a slow deposition rate.

Furthermore, the resistivity of the Si (Si rod) is large, i.e., 1 kiloohm-cm or higher so that it is difficult to pass current through the rod at room temperature. Accordingly, when the reaction is initiated, it is necessary to heat the seed rod from outside by means of a preparatory heating device up to a temperature that enables heating by passage of electrical current. Not only is a special high-voltage power supply device required for this heating, but a large amount of electric energy is consumed; as a result, this is a factor that increases the cost.

A method using a slender core rod comprising a metal such as Mo, W, Ta, Nb or the like with a high recrystallization temperature instead of the Si seed rod used in the Siemens method is also widely known (Patent Document 4). However, in cases where (for example) a simple metal of Mo is used, because of thermal expansion, electrical vibrations or the like caused by electric heating, or if the reaction temperature exceeds the recrystallization temperature (900° C.) of Mo the rod becomes flexible, and then forms recrystallized particles of the cubic system, becoming embrittled so that deformation readily occurs in response to the load, thus causing the silicon product obtained to assume a bent shape, sometimes resulting in contact with adjacent carrier core rods, so that the electric circuit is short-circuited, causing the reaction to be interrupted.

In the case of a Ta simple metal, embrittlement occurs as a result of a reaction with hydrogen at a high temperature, and in the case of Nb and W simple metals, the recrystallization temperature is 1150° C. or higher, but the impact strength drops, so that both metals suffer from problems relative to the strength.

Furthermore, in the case of SEG-Si obtained by using a slender core rod comprising metals such as Mo, W, Ta, Nb or the like, the core part must be removed by some method following completion of the reaction. Accordingly, it is recommended to use a "slender" core rod. However, since the core part that is embrittled following completion of the reaction is brittle and tends to crumble, it is difficult to remove this core part completely from the SEG-Si under visual inspection. Moreover, the following problem has also been encountered. Namely, these metals cause diffusion into the silicon that is deposited and grown, thus causing a deterioration in the purity of the product. Furthermore, a product that has once been used cannot be reutilized, so that the use of these expensive carriers is likewise not a satisfactory method in respect of cost, and has not reached the stage of practical use.

On the other hand, except for the high cost, the Siemens method is an indispensable technology for the manufacture of high-purity polycrystalline silicon. Accordingly, it will be understood that, if the productivity of the initial stage of the reaction in the Siemens method can be improved as described above, high-purity polycrystalline silicon can easily be obtained at low costs.

Since the polycrystalline silicon obtained by the monosilane method uses monosilane as the starting material, there is no chlorine contamination, and this polycrystalline silicon has a higher purity than that obtained by the Siemens method, and is used mainly as the base material for manufacturing single crystals by the FZ method. Products manufactured by the FZ method have a uniform diameter, and have a large diameter that is as close as possible to the diameter available when a single crystal is formed. Furthermore, such products contain no impurities such as infusible powders or the like, and in cases where a product with no bending is required, various modified techniques have been proposed for this purpose. For example, a method in which the gas flow rate through the furnace is stipulated in order to remove the boundary film that accumulates around the heating filament in order to accelerate the deposition of silicon (Patent Document 5), a method in which the reaction gas is fed over the cooling wall of a dust catcher together with the associated silicon powder in order to prevent deposition and admixture of an infusible powder (Patent Document 6), a method in which a major portion of the reaction mixture leaving the decomposition vessel is recycled into the supply line of the decomposition vessel in order to accomplish the decomposition of monosilane at an effective rate (Patent Document 7), a method in which the filament core wire interconnection bridge is constructed from tantalum, molybdenum, tungsten or zirconium so that the temperature does not become excessively high during the passage of electric current through the system (Patent Document 8) and others have been proposed.

However, in cases where the member is constructed from one of the metals cited in Patent Document 8, as is described above, recrystallization occurs at 1200° C. or higher, so that the member becomes brittle, thus making reutilization impossible.

Furthermore, monosilane readily takes fire; accordingly, not only is an extensive security apparatuses are required for the handling of this gas, but, since a fine powder is produced as a by-product during the reaction, the yield is low, and the drawback of a high manufacturing cost is encountered.

Various methods were proposed and tested in the past as the method for the exclusive manufacture of a (high-purity) polycrystalline silicon as the base material for use in solar cells. The ultimate object of such methods is to provide a high-quality product at low costs. In particular, although there is a desire for an inexpensive high-purity silicon base material exclusively for use in solar cells, there is regrettably no such exclusively usable base material source to be found.

Currently, the polycrystalline silicon base material that is used in solar cells is found in "low-grade SEG-Si" obtained as a by-product from processes manufacturing semiconductor-grade polycrystalline silicon or IC-grade silicon wafers, lump-form scraps (tops, tail portions, crystal side surface shavings of single crystal boules, crucible residues) or Si wafer scraps. However, there are limits to the amount of by-product scraps available, and in recent years, this amount has tended to decrease, so that the guaranteed supply sources with constancy for polycrystalline silicon in the development of solar cells has become a major problem.

In order to achieve a low cost, it is necessary that the starting material be inexpensive, and there have been many attempts to ensure this. One of these attempts is to purify metallic silicon (MG-Si) or by-product silicon from the semiconductor industry. For example, methods in which purification is accomplished by spraying a plasma jet gas at the surface of molten silicon with a plasma gas (Patent Document 9, Patent Document 10, Patent Document 11), a method using a direct-current arc furnace (Patent Document 12), and a method utilizing an electron beam, are known. Furthermore, numerous means have been proposed such as a method in which silicon debris discarded from the semiconductor industry are purified by a unidirectional solidification treatment (Patent Document 13), methods in which purification is accomplished by adding an inert gas and an active gas or a powder such as CaO or the like to molten silicon (Patent Document 14, Patent Document 15), methods in which purification is accomplished utilizing a difference in the boiling points with MG-Si placed under reduced pressure (Patent Document 16, Patent Document 17) and the like. However, no method producing satisfactory results using the starting materials obtained by these methods has yet been rendered to practice.

As for the reasons that it is difficult to purify molten silicon, the fact that silicon atoms readily form stable compounds with other atoms is also one factor; however, the main reason is that the p-type impurity B (boron) cannot easily be removed from silicon. The solid-liquid distribution (segregation) coefficient of B with respect to Si is close to 1, i.e., 0.81. Accordingly, separation and purification cannot be accomplished by a solid-liquid separation method such as unidirectional solidification or the like. Complete treatment of the system as a whole is difficult even if the boiling points differ, the blowing in of a gas or the like is utilized.

The method of purification relative to B is that it is a method in which "metallic silicon" is chemically reacted with "hydrochloric acid" to form a silane gas followed by distillation or adsorption to separate and purify the chlorinated boron formed by the reaction of B+HCl. The purified silane gas containing no impurities is then reduced to produce high-purity SEG-Si. The method of the present invention is usually called the gas purification method; the Siemens method and monosilane method are also each a variation of this method. Both of these methods involve numerous manufacturing processes and consume large amounts of energy; accordingly, the methods suffer from the drawback of a high cost, and there are problems in using these methods for the starting materials in solar cells.

Thus, with regard to the removal of B, gasification or cutting by distillation is the most reliable method. The gasification of B also results in the gasification of other impurity elements found as a solid solution in the Si, with these elements being removed by the difference in the boiling point. Methods known as the gasification methods besides the above-mentioned Siemens method and monosilane method include a fluidized bed reaction. In an externally heated reaction furnace, the starting materials (trichlorosilane+hydrogen) are supplied from the lower part of the reaction furnace, fine particles of Si are caused to be fluidized through the furnace, and the product is deposited to grow on the fluidized particles, so that polycrystalline silicon is produced. Following the reaction, the gas is discharged from the upper part of the furnace (Patent Document 18, Patent Document 19). The purity is six-nines (99.9999%) or higher, and satisfies the requirements for the solar cell grade.

In this method, a high-purity product can be obtained at a low cost; however, since the reaction is performed using an externally heated reaction furnace, Si is deposited and grown even on the inside surfaces or the reaction tube, so that a continuous reaction cannot be performed, and an increase in the size of the reaction tube presents a bottleneck, and the method has unfortunately not yet been adapted to practical use.

It is seen from the above that, if it is desired to obtain polycrystalline silicon having a high purity, the gasification method is superior. Furthermore, the difference in the starting materials used for semiconductors and solar cells is a difference in purity; in the former case, a purity of eleven-nines (11N) or higher is reportedly sufficient, while, in the latter case, it is sufficient if the purity is of six-nines (99.9999%) (5 orders of magnitude lower) or higher. Accordingly, it is seen that, if a method can be developed which satisfies the target purity, provides a cost that is levels lower than that of the former method, and enables constant supply, this can provide an "exclusive starting material source for solar cells".

[Patent Document 1] Japanese Patent Application Publication No. 6-41369
[Patent Document 2] Japanese Patent Application Laid-Open No. 5-139891
[Patent Document 3] Japanese Patent Application Laid-Open No. 6-172093
[Patent Document 4] Japanese Patent Application Laid-Open No. 47-22827
[Patent Document 5] Japanese Patent Application Laid-Open No. 63-123806
[Patent Document 6] Japanese Patent Application Laid-Open No. 8-169797
[Patent Document 7] Japanese Patent Application Laid-Open No. 61-127617
[Patent Document 8] Japanese Patent Application Laid-Open No. 3-150298
[Patent Document 9] Japanese Patent Application Laid-Open No. 63-218506
[Patent Document 10] Japanese Patent Application Laid-Open No. 4-338108
[Patent Document 11] Japanese Patent Application Laid-Open No. 5-139713
[Patent Document 12] Japanese Patent Application Laid-Open No. 4-37602
[Patent Document 13] Japanese Patent Application Laid-Open No. 5-270814
[Patent Document 14] Japanese Patent Application Laid-Open No. 4-16504
[Patent Document 15] Japanese Patent Application Laid-Open No. 5-330815
[Patent Document 16] Japanese Patent Application Laid-Open No. 64-56311
[Patent Document 17] Japanese Patent Application Laid-Open No. 11-116229
[Patent Document 18] Japanese Patent Application Laid-Open No. 57-145020
[Patent Document 19] Japanese Patent Application Laid-Open No. 57-145021

DISCLOSURE OF THE INVENTION

The present invention was devised in view of the above facts; it is an object of the present invention to provide means that can increase the deposition rate from the initial stage of the reaction without any need for an external heating means from the initial stage of heating of the center core on which the silicon polycrystals are deposited, which can also increase the deposition rate from the initial stage of the reaction, and which enables repeated use of the core member so that a high-purity polycrystalline silicon can be obtained with constancy at low costs.

The present invention has been completed as a result of the extensive studies on the methods for manufacturing polycrystalline silicon with a greatly increased productivity. The method of the present invention for manufacturing polycrystalline silicon is a method in which a starting-material silane gas is supplied to a seed rod heated inside a sealed reaction furnace at a high temperature, characterized in that an alloy member having a recrystallization temperature of 1200° C. or higher is used as the seed rod. The abovementioned alloy member having a recrystallization temperature of 1200° C. or higher including an alloy selected from the group consisting of rhenium-tungsten (Re—W), tungsten-tantalum (W—Ta), zirconium-niobium (Zr—Nb) and titanium-zirconium-carbon-added molybdenum (TZM) alloys; it is desirable that this member be a wire form material with a diameter of 0.5 mm or larger, a plate with a thickness of 1 mm or larger, a prismatic rod in which one side of the cross section is 1 mm or larger, or a tubular material with an outer diameter of 1 mm or larger, a wall thickness of 0.2 mm or larger and an inner diameter of 5 mm or smaller; in particular, it is desirable that the material of the seed rod be a lanthanum-added molybdenum alloy.

It is desirable that such plate materials, wire materials, prismatic materials or tubular materials have a tapered form; it is desirable that tubular materials be a hollow duplex tube in a tapered form. Furthermore, the above-mentioned alloy members can be reused.

The solar cell-grade polycrystalline silicon obtained by the present invention is characterized in that the starting-material silane gas is trichlorosilane, the silicon is polycrystalline silicon manufactured by the above-mentioned manufacturing method, the resistivity is n-type 2 to 500 ohm-cm, and the lifetime is 10 to 500 microseconds.

The scope of the method of the present invention is that an alloy member which has a recrystallization temperature of 1200° C. or higher, a large cross-sectional dimension and conductivity even at room temperature is used as a seed rod instead of the Si seed rod described above. Otherwise, the materials and structures of the reaction furnace, the mixing proportion and flow rate of the silane gas and hydrogen gas, and various other conditions such as reaction temperature, time and the like, are the same as in the conventional method, so that no alteration is required. Furthermore, heating in the initial stage of the reaction is easy, and the takeout time of the product silicon following the reaction can be shortened since the alloy member can be rapidly cooled, so that a reduction in cost can be achieved. With regard to the purity of the product obtained, there is very little contamination by the alloy member, so that high-quality polycrystalline silicon can be manufactured in large quantities at low costs. With regard to the purity of the product obtained, there is very little contamination by the alloy member used; accordingly, polycrystalline silicon for semiconductors and solar cells can be manufactured inexpensively and in large quantities.

BEST MODE FOR CARRYING OUT THE INVENTION

With regard to the cross-sectional dimensions of the alloy member used in the present invention instead of an Si seed rod, it is desirable that the cross section be as large as possible, both in the strength, and in order to increase the deposition area (deposition rate) of silicon in the initial stage of the reaction. Since the alloy member that is used instead of the Si seed rod is metallic, unlike ceramics or the like, this member is superior in the strength, so that slender and thin working is possible. Accordingly, if the silicon deposition rate in the initial stage of the reaction is disregarded, wire materials with a diameter of 0.5 mm can also be manufactured. The same is true of the thickness and width of plate materials. However, in the case of a wire diameter of 0.5 mm or smaller or a plate material with a thickness of 1 mm or smaller, there can be a trouble of bending or collapsing of the carrier as a result of physical forces such as electric vibrations or the like, or stresses generated in the carrier (core material) by thermal expansion during electric current heating. Furthermore, during the reaction, these surfaces may be converted to a silicide, and thus become brittle in the strength, so that reutilization becomes impossible. However, since the surface of the core material is converted into a silicide, Mo does not diffuse into the silicon, so that, even if there is contamination of the product, this contamination is extremely slight.

Meanwhile, with regard to the maximum diameter of the wire material or maximum thickness of the plate material, the electric power required for heating increases as these values increase, so that a larger power supply unit becomes necessary. Accordingly, although the maximum diameter of a wire material or maximum thickness of a plate material is limited by the capacity of the heating unit, members inside the reaction furnace can also be heated in an auxiliary manner by using an external heating means in combination. Accordingly, if the capacity is sufficient, a diameter or thickness of 100 mm or larger is also possible. Furthermore, the shape used may be a rod, plate or the like, and the diameter may be uniform or have a tapered form. The reason for applying a tapered form is that this is convenient for facilitating withdrawal of the product from the core material.

In order to improve the productivity, the core material may have a hollow tubular structure or duplex tubular structure in a tapered form applied so that the inside of the reaction tube can be quickly cooled, thus allowing rapid recovery of the deposited or as-grown polycrystalline silicon following the reaction. The wall thickness of the hollow tube is 0.2 mm or larger, preferably 0.5 mm or larger. In the case of a duplex tube with an outer diameter of 5 mm or larger, the diameter of the inner tube is a size that fits within the outer tube. In cases where the diameter of a hollow tube is smaller than 0.2 mm, this is undesirable for the same reasons as described above. On the other hand, in the case of the maximum diameter and maximum thickness, the upper limits for both of these are selected in accordance with the magnitude of the heating electric power capacity. In most cases, a maximum diameter of 15 mm and a maximum thickness of 3 mm are recommended. Furthermore, with regard to the thickness and material of the duplex tube set in a hollow tube, it is desirable to use the same values as those of the members used in the present invention, which have heat resistance; however, since there is no direct contact with the reducing hydrogen gas, ordinary heat-resistant materials may also be used.

A schematic axial cross sectional view of the hollow duplex tubular member is shown in FIG. 1.

In FIG. 1, 1 indicates the base plate of the reaction furnace; a bell jar (not shown in the figure) is mounted on top of this base plate. 2 indicates a member-supporting stand inside the bell jar; this stand supports the outer tube 3 of the duplex tube. As a result of the reaction, polycrystalline silicon (not shown in the figure) is deposited on the outside surface of the outer tube 3.

4 indicates an inner tube. A cooling medium (gas) is introduced (arrow 5) into the inner tube 4; this cooling medium flows into the inside of the outer tube 3 from an upper opening (not shown in the figure), and is discharged downward (arrow 6) while cooling the outer tube 3.

It is desirable that the surface of the core material (seed rod member) be smooth so that the growing rate of the polycrystalline silicon layer is uniform. However, it is not absolutely necessary to finish this surface to mirror polish. The reason for this is as follows: namely, the polycrystalline silicon that is obtained must be removed from the core material following completion of the reaction, and forms a lump form material. Accordingly, this cannot be used in the FZ method, which requires a rod-form starting material, and constitutes a CZ (Czochralski) method or casting method starting material. Furthermore, since the alloy member is meant for reuse, if there is an excessive requirement for surface smoothness during reuse, a new expenditure for this purpose will be required, which is inhibitive against the intrinsic object of the present invention for cost reduction.

Examples of the alloy materials having a recrystallization temperature of 900° C. or higher include Re—W (rhenium content 10% or lower; recrystallization temperature 1500 to 1650° C.), W—Ta (tungsten content 5% or lower, recrystallization temperature 1550 to 1650° C.), Zr—Nb (zirconium content 1.5% or lower, recrystallization temperature 1200 to 1350° C., TZM alloys (recrystallization temperature 1250 to 1450° C.), and TEM alloys (most conventional center composition Ti:Zr:C=0.5:0.07:0.005 each in mass %; recrystallization temperature 1250 to 1450° C., usually). However, these alloys all form cubic-system recrystallized particles at temperatures exceeding the recrystallization temperature, and become embrittled so that the high-temperature strength is lost in the same manner as in simple Ta and W; accordingly, highest attention must be paid to the temperature of the atmosphere (reaction temperature) during use.

Meanwhile, examples of alloy materials which recrystallize at a recrystallization temperature of 900° C. or higher but are not embrittled include lanthanum-added molybdenum alloys (recrystallization temperature 1350° C.). Methods that are already known in the industry can be used to manufacture lanthanum-added molybdenum alloys. For example, a Mo powder containing several percent lanthanum (La) (mass ratio) as a doping agent is subjected to hydrogen reduction, and is then pressed and sintered. The resulting block is subjected to at least one type of works selected from the group consisting of hot forging and hot rolling, and is then heated at a temperature that is not lower than the recrystallization temperature, so that the particles are subjected to a coarsening treatment, thus producing the final product (for example, see Japanese Patent Application Publication No. 2-38659, Japanese Patent Application Publication No. 3-22460). In lanthanum-added molybdenum alloy materials obtained by these methods, the particle size of the crystals is increased by the La dopant; next, the material is formed into a long slender fiber form by rolling works. Accordingly, the following characterizing feature is shown: namely, even if the material is heated to a temperature exceeding the recrystallization temperature, cubic fine crystals are not obtained, so that there is little deformation at high temperatures, and plastic working is possible even if the material is returned to room temperature, so that there is likewise little loss of the impact strength.

With regard to the method for setting the alloy members used in the present invention in the reaction furnace, the members are set in an inversely U-formed disposition (gate type) in an electrode holder on the base plate in the same manner as in the conventional Siemens method or monosilane method known in the art. The members can also be set aslant (in a peak type) with an inclination in the reaction furnace; in the case of this method, horizontal bridging member is unnecessary.

With regard to various conditions relating to the method for connecting the member used in the present invention and the electrode holder, the method used in disposing these parts inside the furnace, the power supply circuit connecting method, the method used for preventing contact between members positioned in close proximity to each other and the like, methods that are widely known in the industry can be employed, and there is no need to add any special means.

The reaction method and conditions are also substantially the same as those used in the cases where an Si seed rod is used.

Trichlorosilane is thermally decomposed at a temperature of 1000 to 1200° C. The only difference between the Si seed rod in the Siemens method and the monosilane method and the alloy member used in the present invention is that in the case of the alloy member, electric current heating is possible from the initial stage of the reaction, so that the reaction can be completed within a short time, thus resulting in a low production cost and lower power supply units (low cost). The "polycrystalline silicon" thus obtained is crushed into small lumps having a size of 20 mm to 100 mm called nuggets, and is used as a base material for the manufacture of polycrystalline silicon by the CZ (Czochralski) method. Meanwhile, in the alloy member, in cases where a lanthanum-added molybdenum alloy material is used, as described above, there is flexibility even after the polycrystalline silicon is cut and removed following the reaction, and the material has the same strength as before the reaction, so that reutilization is possible.

The advantages of using the alloy member are as follows:

a. Since a large core diameter can be used, the productivity in the initial stage of the reaction is high.

b. Since electric current heating can be performed already in the initial stage of the reaction, the power consumption per unit production can be so small or, namely, the power consumption per unit production required for electric current heating can be very small as compared with Si seed rods.

c. Since the members once used can be reused, the cost is reduced.

By way of a. to c. above, the base material of semiconductor-grade polycrystalline silicon can be obtained at low costs.

In addition to a. through c., in order to achieve a further decrease of the costs, besides replacement the seed rod with an alloy member, d. even if a low-cost starting material (low-purity trichlorosilane) is used, the polycrystalline quality that is obtained satisfies the requirement for the solar cell-grade polycrystalline silicon purity; accordingly, the cost can be decreased still further.

Specifically, it is seen that a polycrystalline silicon base material exclusively for use in solar cells can be obtained at a low cost.

The cost of the trichlorosilane starting material is proportional to the purity. The purity is determined by the boron concentration contained in the trichlorosilane, so that the cost is inversely proportional to the boron content. The boron content in a semiconductor grade product is on the ppb level; and is on the ppm to percent (%) level in the chemical grade products. Specifically, there is a difference of three orders of magnitude or larger, and the cost of the latter product is much lower.

The purity of the SEG-Si that is obtained using trihclorosilane with a boron content in the ppb level is eleven-nines. At this level, the accuracy of the analytical results is also affected by the analytical method. However, the general standard quality is as follows: namely, the total content of the six elements Fe, Cu, Ni, Cr, Zn and Na is 5 ppb (measurement method: ICP method) or lower, the donor amount including Al (aluminum) and B is 0.1 ppb (measurement method: photoluminescence method) or lower, and the resistivity as n type is 1000 ohm-cm (measurement method: 4-probe method) or higher.

Meanwhile, the purity of the "metallic" silicon (MG-Si) used in silicone resin production is 98 to 99% (1 to 2-nines level). With regard to the method used for manufacturing the "metallic" silicon, this "metallic" silicon is obtained by reducing silica stone ($SiO_2$) with carbon (C). The conduction type and resistivity are p-type and within the range of 0.05 to 0.6 ohm-cm, and the lifetime is in the range that cannot be determined (0 second level); accordingly, this cannot be used as a base material for solar cells.

Polycrystalline silicon of the solar cell grade (SOG-Si) is ranked in an intermediate position between SEG-Si and MG-Si. With regard to the overall level of various element impurities contained in SOG-Si, no clearly stipulated standards are known in the prior art.

However, there are reports available regarding cases assuming that the impurity contained in silicon is a single element.

According to these reports, the upper limits of the contents of the respective elements are Ni/5.0 (ppm, same applies to below), C/4.2, Al/0.57, Cu/0.31, B/0.3, Sb/0.06, Fe/0.023, P/0.015, Cr/0.0092, Ti/0.001 or lower. However, these values are values for the cases where these metallic elements are contained singly as an impurity in the silicon, and do not make any suggestions regarding the cases in which two or more of these elements are combined in the system as a whole. According to experimental results obtained by the inventors, it was demonstrated that it was unreasonable to treat the entire system by stipulating the contents of individual single elements. The reason therefor is as follows: not only do the impurity contents in the MG-Si constituting the starting material differ according to the manufacturing site (manufacturer), but impurity contamination caused by various elements is brought about by reactor members in the subsequent reaction process.

Determination of the elements contaminating the polycrystalline silicon base material produced in large quantities for each of the individual base materials used requires great expenditure and time, and is not economical. As a result of the extensive investigations it has become clear that it is advisable to stipulate the quality of SOG-Si in terms of the conduction type, the resistivity and the lifetime. The respective values are n-type for the conduction type, 2 to 500 ohm-cm for the resistivity, and 10 to 500 microseconds for the lifetime.

In order to produce a solar cell wafer, SOG-Si is used as the base material, this is converted into a single-crystal (CZ method) or polycrystalline (casting method) silicon, and this is then sliced to a wafer having the desired thickness. Silicon wafers used in current solar cells are n or p conduction type, single-crystal or polycrystalline, and have a resistivity of 0.5 to 8 ohm-cm. Accordingly, the quality of the SOG-Si constituting the starting base material prior to slicing into wafers must be a quality that is equal to or better than that.

Now, if the SOG-Si quality is n-type with a resistivity of 2 ohm-cm, and is converted to polycrystalline without addition of a doping agent, the silicon is contaminated by p-type impurities from the peripheral members used in the apparatus during the conversion into polycrystalline, so that the crystal obtained is a p-type crystal, and the resistivity is also decreased. Accordingly, with regard to the quality of the solar cell SOG-Si, it is desirable that the conduction type be n-type, and that the resistivity be 2 ohm-cm or higher. The upper limit of the resistivity is 500 ohm-cm; silicon with a higher resistivity is used for IC's, and is too expensive for solar cell use. Furthermore, with regard to the quality of commercially marketed SEG-Si, the conduction type is usually n-type, and the resistivity is 1000 ohm-cm or higher.

As is described above, solar cell silicon base material does not require purity or shape of the semiconductor level. In the present invention, because of the above-mentioned advantages of a. through d., it is seen that an inexpensive solar cell-grade polycrystalline silicon base material can be manufactured. There are likewise no problems in quality.

EXAMPLES

Example 1

A hollow tube having an outer diameter of 9 mm and a height of 300 mm was prepared by subjecting, to a rounding work, a plate material of a lanthanum-added molybdenum alloy doped with lanthanum (La) of 0.1 mm thickness (trade name TEM Material: product by Allied Materials Co.). This was set in a gate form in a quartz glass bell jar (inner diameter 120 mm, height 500 mm), and was heated by passing electric current through. The method used for setting this in a gate form was as follows: namely, the upper end of each of the vertical tubes was cut into a V notch, and a horizontal pipe was mounted on top thereof. After the temperature of the core surface had reached 1180° C. as measured by an optical pyrometer, hydrogen gas after bubbling through a trichlorosilane liquid (temperature 25° C.) was supplied at 0.6 ml/minute, the hydrogen gas introduced directly into the reactor was supplied at 10.8 ml/minute, and hydrogen gas for reactor window use supplied to the inside surface of the reactor from the bottom part of the reactor was supplied at a flow rate of 0.3 ml/minute, for a total supply rate of 11.7 ml/minute, and the reaction was terminated after lapse of 8 hours. When the diameter was measured, this diameter had grown to 16.2 mm. The tricholorosilane used was electronics grade trichlorosilane, and the concentration of B (boron) in the trichlorosilane was lower than the detection limit of the chemical analysis method, i.e., lower than 1 ppb. Furthermore, heating from outside was not undertaken.

The block thus obtained had a narrow gap space between the polycrystalline silicon layer and the TEM tube, so that the two parts could easily be separated by tapping with a hammer. Furthermore, the block prior to pulverization was sliced in a thickness of 2 mm, and the lanthanum-added alloy core was pulled out with tweezers; then, the conduction type, resistivity and lifetime of this sample were measured. The measurement methods used were as follows: a laser beam PN detector for the conduction type, 4-probe method for the resistivity, and microwave attenuation method (SEMILAB Co.) for the lifetime. The results obtained were as follows: conduction type n-type, resistivity 5 kohm-cm or higher (measurement limit or higher), lifetime (average value) 470 microseconds. The quality was semiconductor level quality. Furthermore, the lifetime was low to be 67 microseconds in the center portion, and was 870 microseconds in the outer peripheral portion giving an average of 470 microseconds.

Example 2

The reaction was performed in the same manner as in Example 1 using a TEM tube of the same dimensions as in Example 1. The TEM tube was heated for 10 hours at 1800° C. (in a hydrogen atmosphere) prior to the reaction, thus performing a treatment to prevent embrittlement. When the reaction was terminated after 8 hours lapse of time, and the diameter was measured, the diameter had grown to 16.2 mm. No heating means from outside was undertaken.

The block thus produced was subjected to the same treatment as in Example 1, and the conduction type, resistivity and lifetime of this block were measured. The results are shown in Table 1.

Example 3

The reaction was performed in the same manner as in Example 1, except for the fact that the TEM tube used in Example 2 was reused. When the reaction was terminated after 8 hours lapse of time, and the diameter was measured, the diameter had grown to 16.1 mm. No heating means from outside was undertaken.

The block thus produced was subjected to the same treatment as Example 1, and the conduction type, resistivity and lifetime of this block were measured. The results are shown in Table 1. Furthermore, the amounts of Mo and La in the Si block following the reaction were determined. Both of these contents were not exceeding 1 ppb.

Examples 4, 5, 6 and 7

Reactions were performed by the same method as in Example 1 with the reaction time set at 4, 8, 14 and 20 hours, respectively. In these cases, the TEM tubes of the same dimensions as in Example 2 were used after being subjected to a heat treatment by the same method. When the reactions were terminated after lapse of the respective reaction times, and the diameter of the product was measured, the amounts of the deposition shown in Table 1 were obtained. The amount of deposition was 85 g after 4 hours, 180 g after 8 hours, and 507 g after 20 hours. No heating means from outside was undertaken.

The blocks thus produced were subjected to the same treatment as in Example 1, and the conduction type, resistivity and lifetime of these blocks were determined. The results are shown in Table 1.

Example 8

TEM plate with a thickness of 0.3 mm was rounded, thus producing hollow tapered tubes each having an upper-end diameter of 8 mm, a lower-end diameter of 10 mm, and a height of 300 mm. They were set in the form of a gate inside a quartz glass bell jar, and was heated by passing electric current through. As a result of performing the reaction for 8 hours under the same conditions as in Example 1 a polycrystalline silicon layer was grown to have an upper-end diameter of 16.0 mm and a lower-end diameter of 18.3 mm. The hollow tube could be pulled out after the reaction, since this tube had a tapered form. The characteristics of this polycrystalline silicon material are shown in Table 1.

Example 9

A TEM plate having a thickness of 0.2 mm was rounded to produce a duplex tube having an inner tube with a wall thickness of 0.2 mm and a diameter of 2 mm disposed inside a tapered tube having a height of 300 mm, an upper-end diameter of 8 mm and a lower-end diameter of 10 mm. The duplex tube was used to achieve rapid cooling of the reaction system following the reaction, and served as an introduction port for the introduction of a nonvolatile gas. A gas discharge port was formed in the lower part as an integral unit with the electrode holder. Following the completion of the reaction, nitrogen gas was used as a nonvolatile gas, and this was supplied to the inner tube of the duplex tube, so that the silicon rod was rapidly cooled. The polycrystalline silicon produced could easily be separated from the carrier. The reaction conditions were the same as in Example 1, and the reaction was performed for 8 hours. The polycrystalline silicon layer was grown to an upper-end diameter of 16.1 mm, and a lower-end diameter of 18.2 mm. Following the completion of the reaction, the carrier duplex tube could be pulled out, since this tube had a tapered form. Since the TEM material retained flexibility, this material could be reused. The purity of the polycrystalline silicon also satisfied the requirements for the semiconductor grade Si (see Table 1).

Example 10

A TEM plate with a thickness of 1 mm that had been treated to prevent embrittlement was rounded, producing a tube with an outer diameter of 23 mm and an inner diameter of 21 mm. The reaction was performed in the same manner as in Example 2 using this tube. The temperature was elevated to the reaction temperature using an external heating device to compensate for the deficiency in the electrical capacity of the reaction furnace. After an 8-hours reaction, the polycrystalline silicon layer had grown to have a diameter of 28.7 mm.

The silicon produced was separated from the carrier tube, and the conduction type, resistivity and lifetime of the polycrystalline silicon were measured. The results are shown in Table 1. The quality satisfied the requirements for semiconductor-grade silicon. (n type, 5 kohm-cm or higher).

It was noted from Examples 1 through 10 that, if the alloy member of the present invention was used instead of an Si seed rod, and trichlorsilane with electronics grade purity was used as the starting material, "inexpensive semiconductor polycrystalline silicon" having the same quality as a product obtained by the "Siemens method or monosilane method" can easily be obtained. Since the manufacturing cost of the semiconductor-grade polycrystalline silicon obtained is low, this silicon also naturally has the merit of being usable not only for ICs, but also as a solar cell polycrystalline silicon base material (see Examples 14 through 16).

Example 11

The reaction was performed for 8 hours by the same method as in Example 1 using a TEM tube of the same dimensions as in Example 2 which had been subjected to a treatment to prevent embrittling. The B concentration in the trichlorosilane used was 198 ppb (chemical grade product). The analysis method use for B was a chemical analysis method; the average value of analytical values obtained from four measurements was used. When the reaction was terminated and the diameter of the polycrystalline silicon layer was measured after lapse of 8 hours, it was found that this diameter had grown to 16.0 mm. Heating from outside was not undertaken. The results obtained when the conduction type, resistivity and lifetime of this polycrystalline silicon were measured are shown in Table 1.

Example 12

The reaction was performed for 8 hours by the same method as in Example 1 using a TEM tube of the same dimensions as in Example 2 which had been subjected to a treatment to prevent embrittling. The B concentration in the trichlorosilane used was 48 ppb (chemical grade product). The analytical method used for B was the same as in Example 11; the average value of four analytical values was taken. When the reaction was terminated and the diameter of the polycrystalline silicon layer was measured after lapse of 8 hours, it was found that this diameter had grown to 16.1 mm. Heating from outside was not undertaken. The results obtained when the conduction type, resistivity and lifetime of this polycrystalline silicon were measured are shown in Table 1.

Example 13

The reaction was performed for 8 hours by the same method as in Example 11 using a TEM rod with an outer diameter of 9 mm. Prior to the initiation of the reaction, the TEM rod was subjected to a heat treatment for prevention of embrittling in the same manner as in Example 2. When the reaction was terminated and the diameter of the polycrystalline silicon layer was measured after 8 hours had elapsed, it was found that this diameter had grown to 16.0 mm. Heating from outside was not undertaken. The results obtained when the conduction type, resistivity and lifetime of this polycrystalline silicon were measured are shown in Table 1.

TABLE 1

|  |  | Carrier for deposition | Reaction time (hrs.) | Diameter of Si deposition layer (mm) | Conduction type | Resistivity (ohm-cm) | Lifetime (μseconds)** | Remarks |
|---|---|---|---|---|---|---|---|---|
| Example | 1 | TEM tube | 8 | 16.2 | n | * | 470 |  |
|  | 2 | TEM tube | 8 | 16.2 | n | * | 674 |  |
|  | 3 | TEM tube | 8 | 16.1 | n | * | 600 | Reused carrier |
|  | 4 | TEM tube | 4 | 12.0 | n | * | 129 |  |
|  | 5 | TEM tube | 8 | 15.5 | n | * | 457 |  |
|  | 6 | TEM tube | 14 | 19.2 | n | * | 650 |  |
|  | 7 | TEM tube | 20 | 23.7 | n | * | 758 |  |
|  | 8 | TEM tube | 8 | 16.0 18.3 | n | * | 450 | Tapered |
|  | 9 | TEM duplex | 8 | 16.1 | n | * | 467 | Tapered |

TABLE 1-continued

| | Carrier for deposition | Reaction time (hrs.) | Diameter of Si deposition layer (mm) | Conduction type | Resistivity (ohm-cm) | Lifetime (μseconds)** | Remarks |
|---|---|---|---|---|---|---|---|
| | tube | | 18.2 | | | | |
| 10 | TEM tube | 8 | 28.7 | n | * | 371 | |
| 11 | TEM tube | 8 | 16.7 | n | 5 | 139 | Solar grade |
| 12 | TEM tube | 8 | 16.1 | n | 50 | 201 | Solar grade |
| 13 | TEM tube | 8 | 16.0 | n | 5 | 50 | Solar grade |

Notes:
*Outside of determination limit (5 kohm-cm or higher)
**Average value
Notes:
*Out of measurement limits (5 kohm-cm or higher)
**Average value

Example 14

A p-type solar cell grade polycrystalline silicon of 1.0 ohm-cm was prepared by the casting method with the polycrystalline silicon (n-type, 5 k ohm-cm or higher) obtained by extending the reaction time in Example 2 to 24 hours and melted with addition of a p-type mother single-crystal silicon having a resistivity of 0.01 ohm-cm. This polycrystalline silicon was sliced in a thickness of 300 μm, and was then cut to form a 10 mm square wafer of 300 μm (thickness) which was subjected to etching followed by preparation of a 10 mm square solar cell element and the photoelectric conversion efficiency was measured to obtain a value of 18.7%.

Example 15

A p-type solar cell grade polycrystalline silicon of 1.0 ohm-cm was prepared by the casting method from a polycrystalline silicon (n-type, 50 ohm-cm) obtained by extending the reaction time in Example 1 to 24 hours melted with addition of a boron-containing mother single crystal silicon having a resistivity of 0.01 ohm-cm. A solar cell element was prepared therefrom, of which the photoelectric conversion efficiency as measured was 17.9%.

Example 16

A p-type solar cell grade polycrystalline silicon was prepared by the casting method from a polycrystalline silicon (n-type, 50 ohm-cm) obtained by extending the reaction time in Example 12 to 24 hours and melted with addition of a boron-containing p-type mother single crystal silicon. A solar cell element prepared therefrom had a photoelectric conversion efficiency of 18.2%.

It was confirmed from Examples 11 through 16 that "polycrystalline silicon having a conduction type of n, a resistivity of 2 to 500 ohm-cm, and a lifetime of 10 to 500 microseconds" obtained by pyrolysis of a chemical grade base-material of trichlorosilane using the alloy member of the present invention instead of an Si seed rod is useful as an exclusive starting material for solar cell grade polycrystalline silicon. This polycrystalline silicon can easily be mass-produced without modifying existing facilities.

Comparative Example 1

Polycrystalline silicon was prepared under the same conditions as in Example 1 using a pure Mo rod having a diameter of 9 mm as the seed rod instead of the TEM tube used in Example 1. The silicon rod obtained was sliced in a thickness of 1 mm, and an electron microscopic photograph of the surface was taken. The photograph obtained is shown in FIG. 2, according to which, in the boundary ("B" in FIG. 2) between the surface of the Mo (core) ("A" in FIG. 2) and the Si layer (deposited Si) ("D, E" in FIG. 2), the Mo is converted into a silicide, and a crack layer ("C" in FIG. 2) is found between the core material and the deposited Si layer. White streaks run radially toward the outside of the Si, so that the growth of the Si grains is read therein. Furthermore, as a result of recrystallization (see the lower right photograph in FIG. 2), the strength of the core Mo is insufficient, and the Mo was so embrittled that the Mo could not be recovered in the form of a rod. Heating from outside was not undertaken.

Comparative Example 2

The reaction was performed in the same conditions as in Example 2, except that the wall thickness of the TEM tube was 0.05 mm. After initiation of electric current heating, the TEM became curved when the temperature had reached 600° C., so that the reaction could not be performed any longer.

Comparative Example 3

The reaction was performed for 24 hours in the same method as in Example 1, except for the use of trichlorosilane having a B content of 980 ppm. The conduction type, resistivity and lifetime of the polycrystalline silicon obtained were measured to find p-type, 1 ohm-cm and 5 microseconds. A solar cell grade polycrystalline silicon was prepared by the casting method using this polycrystalline silicon without any doping agent. The conduction type, resistivity and lifetime of the casting method polycrystalline silicon obtained were p-type, 0.4 ohm-cm and 3 microseconds. The photoelectric conversion efficiency of the solar cell element prepared therefrom was low, i.e., 9.8%, so that this was unacceptable for use as a solar cell grade polycrystalline wafer.

Reference Example

Siemens Method

A polycrystalline silicon was prepared under the same conditions as in Example 1 excepting for the use of an 8 mm square prismatic single-crystal silicon rod (high-purity semiconductor grade polycrystalline silicon obtained by the FZ method and cut into a 9 mm square prismatic rod) instead of the TEM member (seed rod) used in Example 1. The silicon rod was an insulator at room temperature, so that electric current heating was impossible so that heating from outside was necessary. When the reaction was terminated after 8 hours had elapsed, and the diameter of the polycrystalline silicon layer was measured, it was found that the diameter had grown to 15.8 mm. Although the growth rate relative to the reaction time was the same as in the results obtained by the method of the present invention; a time of two hours was required in order to increase the temperature suitable for the start of the reaction.

The conduction type, resistivity and lifetime of the polycrystalline silicon obtained were measured to find n type, 5 kohm-cm or higher (exceeding the measurement limit) and 1200 microseconds, so that the lifetime was superior to that of the polycrystalline silicon obtained in Example 2 of the present invention. As in the present invention, the requirements for semiconductor-grade polycrystalline silicon were satisfied. However, external heating was required until the reaction could be initiated, so that the productivity per unit time was inferior to that of the method of the present invention.

INDUSTRIAL UTILIZABILITY

In the present invention, heating of the alloy seed rod at the initiation of the silicon deposition reaction can be performed quickly and easily\, so that high-purity polycrystalline silicon can be produced at a low cost, thus making a great contribution to the fields of producing IC-grade and solar cell-grade silicon base materials.

BRIEF DESCRIPTION OF THE DRAWING

[FIG. 1] is a schematic cross sectional view showing a conceptual structure of the duplex tube member used in the present invention.

[FIG. 2] is an electron microscopic photograph of a cross section of the silicon rod obtained in Comparative Example 1.

The invention claimed is:

1. A method for the preparation of polycrystalline silicon comprising the step of providing a starting silane gas and supplying said silane gas to a white-heated seed rod in a closed reaction furnace at a high temperature to thereby deposit high-purity polycrystalline silicon on said seed rod by pyrolysis or by reduction with hydrogen, wherein the seed rod is an alloy having a recrystallization temperature of 1200° C. or higher.

2. The method for the preparation of polycrystalline silicon described in claim 1 wherein the aforementioned alloy is selected from the group consisting of rhenium-tungsten (Re—W), tungsten-tantalum (W—Ta), zirconium-niobium (Zr—Nb) and titanium-zirconium-carbon-added molybdenum alloys; and the seed rod is a non-tubular rod having a form selected from the group consisting of a wire with a diameter of at least 0.5 mm, a prismatic form in which one side of a cross section thereof is 1 mm or larger, and a plate with a thickness of 1 mm or larger; or said seed rod has a tubular form having an outer diameter of at least 1 mm, a wall thickness of at least 0.2 mm and an inner diameter not exceeding 5 mm.

3. The method for the preparation of polycrystalline silicon described in claim 1 wherein the alloy having a recrystallization temperature of 1200° C. or higher is a lanthanum-added molybdenum alloy.

4. The method for the preparation of polycrystalline silicon described in claim 1 wherein the seed rod is tapered.

5. The method for the preparation of polycrystalline silicon described in claim 1 wherein the seed rod is in the form of a tapered hollow duplex tube.

6. The method for the preparation of polycrystalline silicon described in claim 1 wherein the seed rod is reused from a preceding run of the process.

7. The method for the preparation of polycrystalline silicon described in claim 2 wherein the seed rod is tapered.

8. The method for the preparation of polycrystalline silicon described in claim 3 wherein the seed rod is tapered.

9. The method for the preparation of polycrystalline silicon described in claim 2 wherein the seed rod is reused from a preceding run of the process.

10. The method for the preparation of polycrystalline silicon described in claim 3 wherein the seed rod is reused from a preceding run of the process.

11. The method for the preparation of polycrystalline silicon described in claim 4 wherein the seed rod is reused from a preceding run of the process.

12. The method for the preparation of polycrystalline silicon described in claim 5 wherein the seed rod is reused from a preceding run of the process.

* * * * *